United States Patent
Vinn et al.

(10) Patent No.: US 7,195,952 B2
(45) Date of Patent: Mar. 27, 2007

(54) SCHOTTKY DIODE DEVICE WITH ALUMINUM PICKUP OF BACKSIDE CATHODE

(75) Inventors: Chuck Vinn, Santa Clara, CA (US); Martin Alter, Los Altos, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 11/087,913

(22) Filed: Mar. 22, 2005

(65) Prior Publication Data

US 2006/0216855 A1   Sep. 28, 2006

(51) Int. Cl.
 *H01L 21/00* (2006.01)
(52) U.S. Cl. ............... 438/108; 438/109; 257/676; 257/777; 257/778
(58) Field of Classification Search ........ 438/106–108, 438/112, 25, 26; 257/666–678, 686, 690, 257/703
See application file for complete search history.

(56) References Cited

U.S. PATENT DOCUMENTS

| | | | |
|---|---|---|---|
| 6,309,929 B1 | 10/2001 | Hsu et al. | |
| 6,825,073 B1 | 11/2004 | Wu | |
| 6,861,761 B2 * | 3/2005 | Yang et al. | 257/777 |
| 2002/0079590 A1 * | 6/2002 | Nakaoka et al. | 257/777 |
| 2002/0137258 A1 * | 9/2002 | Akram | 438/109 |
| 2004/0169262 A1 * | 9/2004 | Oliver et al. | 257/676 |
| 2005/0040541 A1 * | 2/2005 | Kurita et al. | 257/778 |

OTHER PUBLICATIONS

Data Sheet for MIC2287 "1.2MHz PWM White LED Driver with OVP in 2mm×2mm MLF™ and Thin SOT-23," pp. 1-10, Apr. 2004.

* cited by examiner

*Primary Examiner*—Brook Kebede
*Assistant Examiner*—Su C. Kim
(74) *Attorney, Agent, or Firm*—Patent Law Group LLP; Carmen C. Cook

(57) ABSTRACT

An integrated circuit package includes a semiconductor chip having a passivation layer forming the top surface of the semiconductor chip and a metal pad formed on the passivation layer and a discrete electronic device having a first terminal formed on a first surface and a second terminal formed on a second surface opposite the first surface of the discrete electronic device where the first surface of the discrete electronic device is attached to the metal pad using a conductive adhesive structure. The semiconductor chip and the discrete electronic device are encapsulated in an encapsulation material. An electrical connection is formed between the metal pad and one of a bond pad of the semiconductor chip or a package post of the integrated circuit package. In one embodiment, the metal pad is an aluminum pad and a metal line connects the metal pad to a bond pad of the semiconductor chip.

13 Claims, 4 Drawing Sheets

...

SCHOTTKY DIODE DEVICE WITH ALUMINUM PICKUP OF BACKSIDE CATHODE

FIELD OF THE INVENTION

The invention relates to discrete Schottky diode devices with backside cathode contact and, in particular, to a method for providing backside pickup of the backside cathode contact of a discrete Schottky diode device.

DESCRIPTION OF THE RELATED ART

Step-up converters, or boost converters, are known in the art and operate by taking a DC input voltage and regulating a higher DC output voltage. FIG. 1 is a circuit diagram illustrating a typical circuit configuration of a conventional boost converter. In general, boost regulation of the output voltage $V_{OUT}$ is achieved by turning on a switch internal to the boost converter integrated circuit (IC), which draws current through an inductor L1. When the internal switch turns off, the inductor's magnetic field collapses, causing the voltage $V_{SW}$ at the switching output terminal (SW) to increase until it forward-biases Schottky diode D1, charging up output capacitor C2 to a voltage higher than the input voltage $V_{IN}$.

Most boost converters require a Schottky diode coupled between the switch output node SW terminal of the boost converter IC and the output voltage $V_{OUT}$ node. In most cases, a user needs to buy a discrete Schottky diode separate from the boost converter IC and assembles the discrete Schottky diode on the PC board next to the boost converter IC. Having to use a discrete Schottky diode is undesirable as it is expensive and awkward for the user. The discrete Schottky diode also takes up valuable PC board space.

In portable applications, there is a trend by manufacturers (such as cell phone manufacturers) to minimize the number of components on their PC board. One solution to reducing component count is to integrate the discrete Schottky diode on-chip but an on-chip Schottky diode is not a very cost-effective solution. This is because building a discrete Schottky diode only requires a low number of processing steps but if the Schottky diode is built within the IC chip the a large number of additional processing steps is required and large silicon area is needed to implement the integrated Schottky diode. Therefore the cost of integrating the Schottky diode is inflated.

SUMMARY OF THE INVENTION

According to one embodiment of the present invention, a method for forming an integrated circuit package where the integrated circuit package includes a semiconductor chip having a passivation layer and a discrete electronic device is disclosed. The discrete electronic device includes a first terminal formed on a first surface and a second terminal formed on a second surface opposite the first surface of the discrete electronic device. At least one of the first and second terminals of the discrete electronic device is electrically coupled to the semiconductor chip. The method includes forming a metal pad on the top surface of the passivation layer of the semiconductor chip, attaching the first surface of the discrete electronic device to the metal pad using a conductive adhesive structure to form an electrical connection between the first terminal of the discrete electronic device and the metal pad, forming an electrical connection from the metal pad to one of a bond pad of the semiconductor chip or a package post of the integrated circuit package, and encapsulating the semiconductor chip and the discrete electronic device to form the integrated circuit package.

In one embodiment, the metal pad is an aluminum pad and the conductive adhesive structure includes a conductive epoxy.

According to another aspect of the present invention, an integrated circuit package includes a semiconductor chip having a passivation layer forming the top surface of the semiconductor chip and a metal pad formed on the passivation layer and a discrete electronic device having a first terminal formed on a first surface and a second terminal formed on a second surface opposite the first surface of the discrete electronic device where the first surface of the discrete electronic device is attached to the metal pad using a conductive adhesive structure. The semiconductor chip and the discrete electronic device are encapsulated in an encapsulation material. An electrical connection is formed between the metal pad and one of a bond pad of the semiconductor chip or a package post of the integrated circuit package.

In one embodiment, the metal pad is an aluminum pad and a metal line connects the metal pad to a bond pad of the semiconductor chip.

The present invention is better understood upon consideration of the detailed description below and the accompanying drawings.

DETAILED DESCRIPTION OF THE PREFERRED EMBODIMENTS

Figure 1:
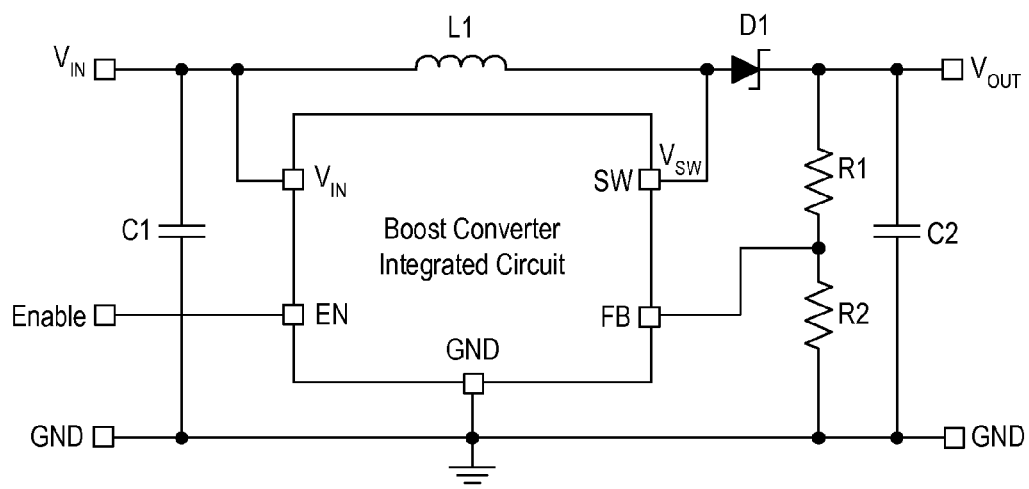
FIG. 1 is a circuit diagram illustrating a typical circuit configuration of a conventional non-synchronous boost converter.

In accordance with the principles of the present invention, a method for forming a chip-on-chip integrated circuit package uses a metal pickup formed on the top surface of a semiconductor chip for electrically contacting the backside electrode of a discrete electronic device. The electronic device can thus be mounted on the top surface of the semiconductor chip so that each can be electrically coupled to the other while being assembled inside the same integrated circuit package. The backside electrode of the discrete electronic device can be electrically coupled to the semiconductor chip or to a package post by the use of a bond wire attached to the metal pickup. The metal pickup is typically an aluminum pad formed on the topmost insulating layer of the semiconductor chip. The backside electrode of the discrete electronic device can also be electrically coupled to circuitry of the semiconductor chip by coupling the metal pickup to metal layers formed on semiconductor chip.

In one embodiment, the electronic device is mounted on an aluminum pad formed on the top surface of the semiconductor chip where the aluminum pad forms the metal pickup of the backside electrode of the electronic device. Electrical connection to the backside electrode of the electronic device can then be made through the aluminum pad. The method of the present invention simplifies the manufacturing of the discrete electronic devices by eliminating the need to bring the backside electrode to the top surface and enables compact assembly of discrete electronic device on a semiconductor chip by direct physical mounting and electrical connection of the electronic device on the semiconductor chip.

In one embodiment, the discrete electronic device is a discrete Schottky diode and the semiconductor chip is a boost converter integrated circuit. The discrete Schottky diode is mounted on the top surface of and above the passivation layer of the boost converter integrated circuit. An aluminum pad is formed on the top surface of the passivation layer of the boost converter integrated circuit to be used as the backside pickup of the backside cathode terminal of the discrete Schottky diode. The anode electrode of the Schottky diode is formed on the topside of the Schottky diode device and is electrically coupled to the switching output terminal (SW) of the boost converter integrated circuit, such as through a bond wire. The cathode electrode of the Schottky diode is formed on the backside of the Schottky diode device and is electrically connected to the aluminum pad functioning as the backside pickup of the cathode terminal. Electrical connection to the cathode terminal can then be made through the aluminum pad.

In this manner, the discrete Schottky diode is physically and electrically coupled to the boost converter integrated circuit to form a fully integrated boost converter IC package. Moreover, the discrete Schottky diode can be incorporated in a chip-on-chip fashion into the package of the boost converter IC without increasing the package size of the boost converter IC because the discrete Schottky diode merely occupies space previously occupied by the packaging encapsulation material.

In one embodiment, a bond wire is attached to the aluminum pad directly to provide the necessary electrical connection of the backside electrode. For example, the aluminum pad can be electrically connected to a package post through the bond wire. In another embodiment, the aluminum pad is electrically connected to a bonding pad on the semiconductor chip through a metal line. A bond wire can then be coupled to the bonding pad for providing electrical connection of the aluminum pad and the backside electrode of the Schottky diode. The topside anode terminal of the discrete Schottky diode can be electrically connected to either a bonding pad of the semiconductor chip or a package post of the package through a bond wire.

By using a backside cathode terminal, the size of the discrete Schottky diode device can be reduced as structures for bringing a cathode contact to the topside of the Schottky diode is eliminated. Such structures, such as N+ sinkers, require additional fabrication steps and additional silicon area. The discrete Schottky diode in accordance with the present invention can be made using very little silicon area and with fewer fabrication steps than an on-chip Schottky diode. In one embodiment, the discrete Schottky diode is formed using only eight masking steps.

Furthermore, by mounting the Schottky diode directly on the top surface of the boost converter integrated circuit to form a fully integrated IC package, a separate discrete component is eliminated in the application of the boost converter and valuable PC board space is saved. Furthermore, the aluminum pad is formed on the passivation layer of the boost converter integrated circuit and can be formed on top of active circuitry of the boost converter integrated circuit so that no additional silicon space is required for mounting the discrete Schottky diode device.

In the following description, the chip-on-chip integrated circuit packaging method is applied to a discrete Schottky diode device for connecting the backside cathode of the Schottky diode to an aluminum pick-up on a boost converter integrated circuit. The chip-on-chip integrated circuit packaging method can also be applied to other discrete electronic devices, particularly those that include a vertical device structure and therefore inherently incorporate device terminals on the backside of the electronic devices (hence, the backside electrodes). Instead of bringing an electrical connection of the backside electrode to the topside of such electronic device, backside pickup of the backside electrode can be advantageously exploited to reduce the size of the electronic device and to facilitate chip-on-chip mounting for components reduction. For example, the chip-on-chip integrated circuit packaging method can be applied to VDMOS devices for providing backside body pickup and NPN or PNP transistors for providing collector pickup. One of ordinary skill in the art, upon being apprised of the present invention, would appreciate that the chip-on-chip integrated circuit packaging method of the present invention can be applied to a wide range of electronic devices for utilizing the backside electrode pickup method to facilitate chip-on-chip mounting.

Furthermore, in the present description, the semiconductor chip or integrated circuit chip to which the discrete electronic device is attached can be any type of integrated circuit chips. The exact configuration or make up of the integrated circuit chip is not critical to the practice of the present invention.

Figure 2:
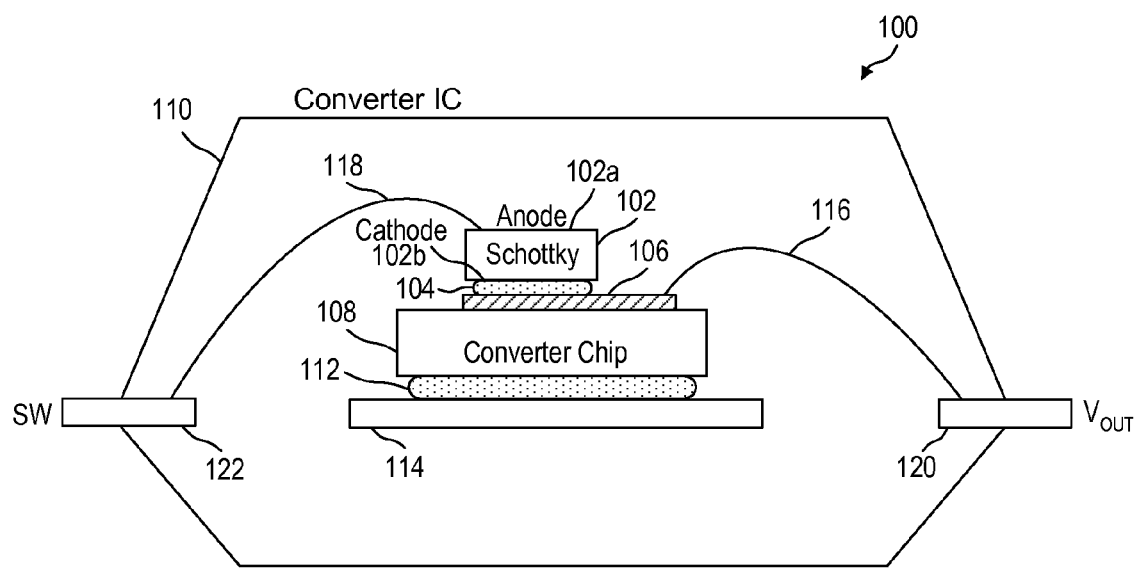
FIG. 2 is a cross-sectional view of a packaged boost converter integrated circuit (converter IC) including a discrete Schottky diode mounted on a boost converter semiconductor chip using the chip-on-chip packaging method according to one embodiment of the present invention.

FIG. 2 is a cross-sectional view of a packaged boost converter integrated circuit including a discrete Schottky diode mounted on a boost converter integrated circuit using the chip-on-chip packaging method according to one embodiment of the present invention. Referring to FIG. 2, packaged boost converter integrated circuit 100 ("converter IC 100") includes a discrete Schottky diode 102 and a boost converter integrated circuit 108 ("converter chip 108") all encapsulated within the same integrated circuit package material 110. Integrating discrete Schottky diode 102 into the same package as converter chip 108 eliminates the need to couple a Schottky diode externally to the converter chip, thereby reducing the component count for applications using converter IC 100. In the following description, the terms "top", "bottom" and "backside" are used to refer to the relative surfaces of the devices and structures and are not intended to denote absolute directions of the surfaces.

In the embodiment shown in FIG. 2, converter chip 108 includes a metal pad 106 on which Schottky diode 102 is mounted. Metal pad 106 is formed on the top surface of the passivation layer of the converter chip and can be formed using one of the metallization layers of the fabrication process used to fabricate converter chip 108. Metal pad 106 is typically an aluminum metal pad and is preferably formed using the second or third metallization layer of the fabrication process. Because metal pad 106 is formed on the passivation layer, the metal pad is therefore electrically isolated from the underlying circuits of the converter chip. Thus, metal pad 106 can be placed over the active circuitry of converter chip 106 and additional silicon area is not needed for accommodating the metal pad. The passivation layer of an integrated circuit chip, such as converter chip 108, is typically made of a material, such as silicon nitride or silicon nitride on silicon oxide, that forms a good barrier for contaminants, such as contaminants from die attach materials. Therefore, mounting the Schottky diode on the top surface of the boost converter IC does not degrade the reliability of the underlying boost converter.

Schottky diode 102 is a discrete device including an anode electrode on the top surface 102a of the diode and a cathode electrode formed on the bottom surface 102b. The backside of Schottky diode 102 is attached to metal pad 106, such as by conductive adhesive 104. Thus, metal pad 106 is electrically connected to the cathode terminal of Schottky diode 102 and forms the backside pickup of the cathode electrode of the Schottky diode. In other words, metal pad 106 functions as the backside cathode of the Schottky Diode.

Converter chip 108, with Schottky diode 102 mounted thereon, is attached by a die attach 112 to a die paddle 114 in a conventional manner. FIG. 2 illustrates only the electrical connection of Schottky diode 102 to converter chip 108 and the package posts/leads of converter IC 100. It is understood that there are bond wires for connecting other terminals or nodes of converter chip 108 to the package posts which are not shown the figure. In FIG. 2, a bond wire 116 connects metal pad 106 to a package post 120. In this manner, the cathode terminal of Schottky diode 102 is connected to the output voltage terminal $V_{OUT}$. A second bond wire 118 connects the anode electrode on the top surface of Schottky diode 102 to a package post 122. By connecting package post 122 to the switching output terminal (SW) of the converter chip, such as through another bond wire connecting post 122 to the bonding pad for the SW terminal on converter chip 108, the anode terminal of Schottky diode 102 is electrically coupled to the switching output terminal (SW) of the converter chip.

By encapsulating Schottky diode 102 in the same package material 110 of converter chip 108, the height of the package is not increased as the Schottky diode merely displaces package material above the converter chip. The thickness of discrete Schottky diode can be made as thin as possible during the fabrication process by thinning the backside of the wafer on which the Schottky diodes are formed. In this manner, converter IC 100 is formed including an integrated discrete Schottky diode, thereby reducing the overall component count in applications employing the converter IC.

Figure 3:
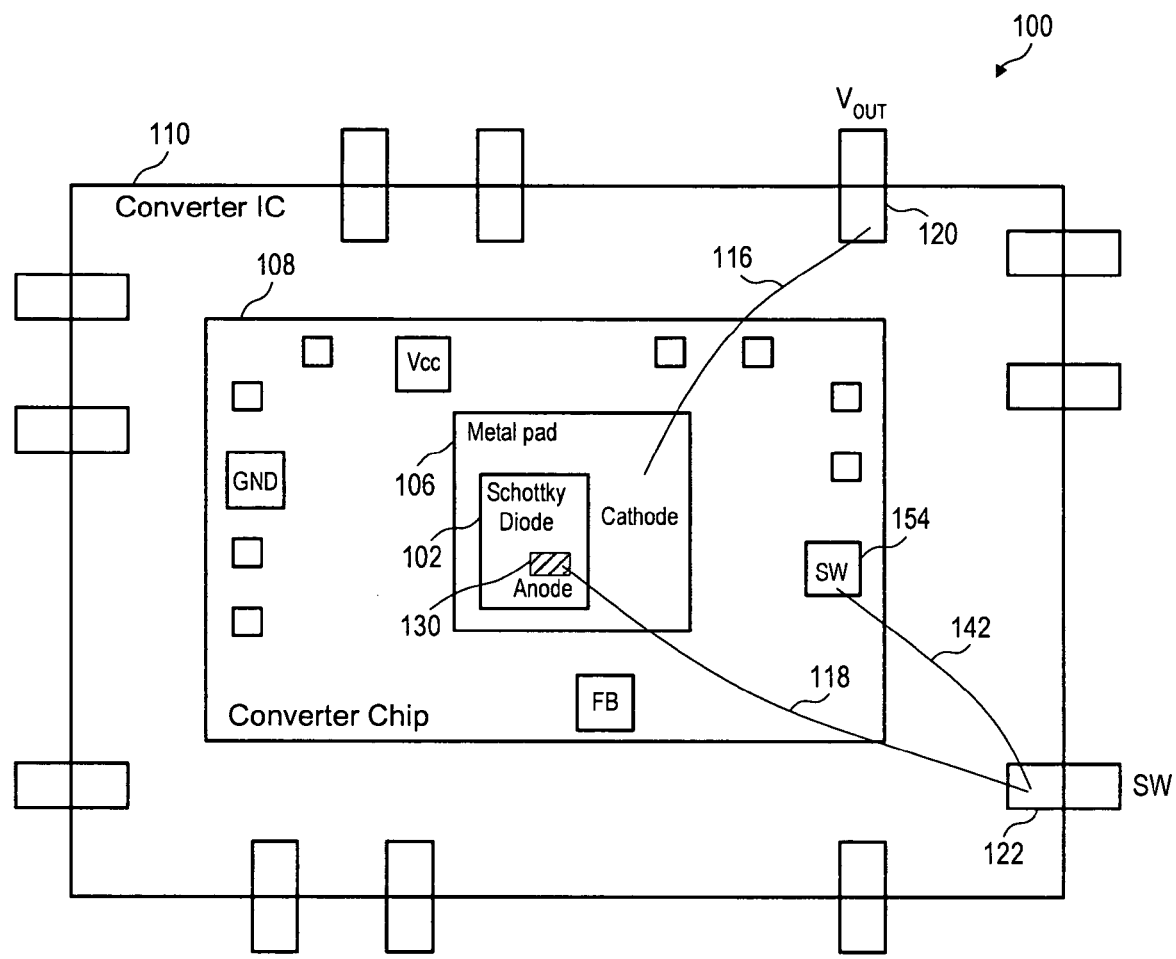
FIG. 3 is a top view of the converter IC of FIG. 2 illustrating the electrical connections of the discrete Schottky diode to the converter semiconductor chip.

When Schottky diode 102 is attached to metal pad 106 and mounted on top of converter chip 108 as shown in FIG. 2, electrical connections to the topside anode and the backside cathode of Schottky can be accomplished in one of many ways. FIG. 2 illustrates one method of connecting both the anode and the cathode terminals using bond wires. FIG. 3 is a top view of converter IC 100 illustrating the electrical connections of Schottky diode 102 as used in FIG. 2. Referring to FIG. 3, a metal pad 130 is formed on the top surface of Schottky diode 103 as the anode electrode of the diode. Bond wire 118 connects anode electrode 103 to a package post 122 which is the switching output pin SW of converter IC 100. A second bond wire 142 connects package post 122 to a pad 154 on converter chip 108. Pad 154 is the bond pad for the switching output terminal SW of converter chip 108. By use of bond wires 118 and 142, the requisite connection for the anode terminal of Schottky diode 102 is made. In the embodiment shown in FIGS. 2 and 3, the backside cathode terminal of Schottky diode 102, being picked up by metal pad 106, is connected via bond wire 116 to package post 120 which is the output voltage pin $V_{OUT}$. In this manner, the electrical connections of the Schottky diode to the converter chip are complete and converter IC 100 can be applied in voltage regulation applications without the need to secure an external Schottky diode.

Figure 4:
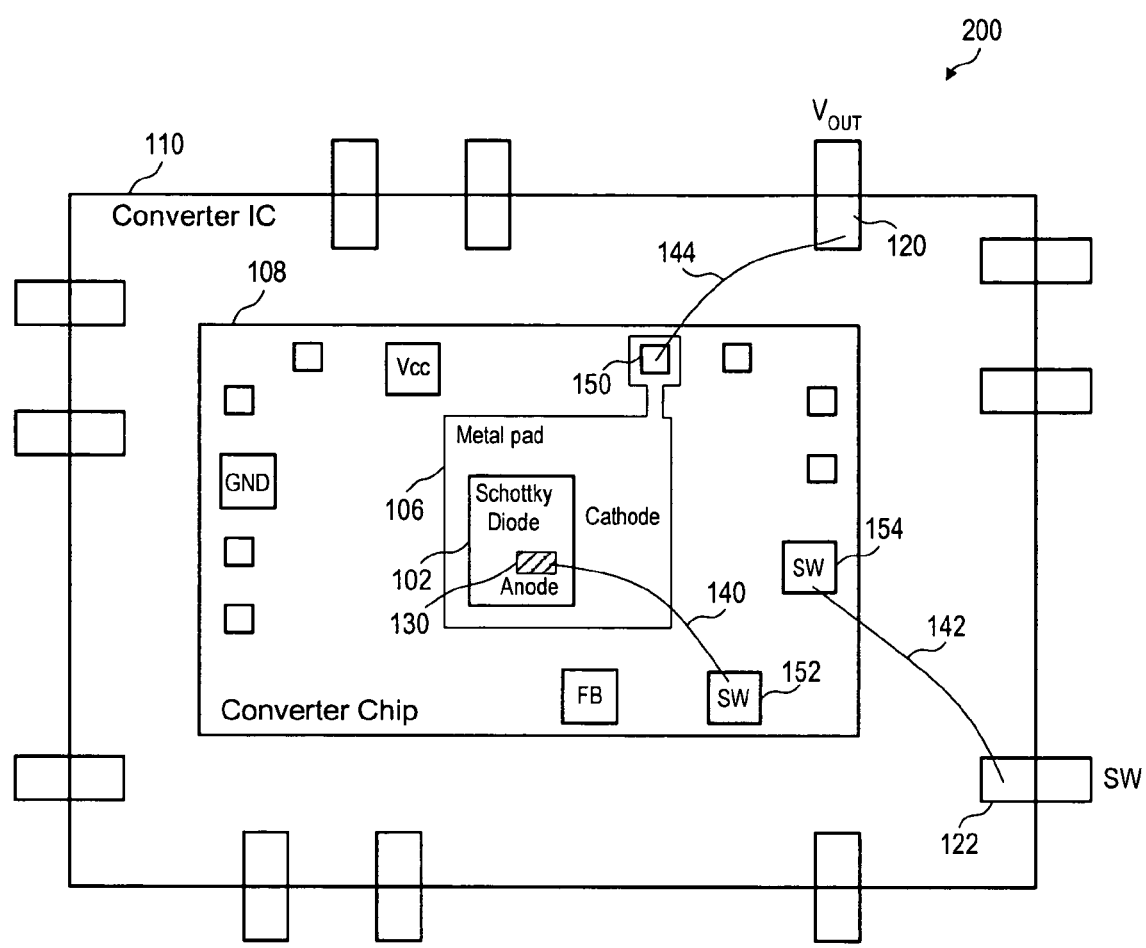
FIG. 4 is a top view of a converter IC illustrating the electrical connections of a Schottky diode mounted on a converter chip according to an alternate embodiment of the present invention.

FIG. 4 is a top view of a converter IC illustrating the electrical connections of a Schottky diode mounted on a converter chip according to an alternate embodiment of the present invention. Like elements in FIGS. 2–4 are given like reference numerals to simplify the discussion. Referring to FIG. 4, converter IC 200 includes Schottky diode 102 attached to a metal pad 106 on converter chip 108 in the same manner as described above. However, in the present embodiment, metal pad 106 includes a metal line extension which connects to a bond pad 150. In one embodiment, metal pad 106 is an aluminum metal pad and is formed using a second or third metallization layer of the fabrication process for forming converter chip 108. The bond pad extension of metal pad 106 overlies bond pad 150, thereby forming an electrical connection to bond pad 150. A bond wire 144 connects bond pad 150 to package post 120 which is the output voltage pin $V_{OUT}$. By use of a metal line extension connecting metal pad 106 to a bond pad, electrical connection to the backside cathode terminal of Schottky diode 102 can be made using a more conventional wire bonding method. That is, by connecting metal pad 106 to a bond pad, electrical connection to the backside cathode can be made through a bond pad instead of directly on the metal pad itself. Directly connecting a package post to the metal pad may requiring a longer bond wire and special assembly process.

Another advantage of using a metal line extension to connect metal pad 106 to bond pad 150 is that the metal pad can now be connected directly to the underlying circuitry of converter chip 108. This electrical connection method is useful in applications when the backside electrode does not need to be brought out of the IC package 110. In this manner, electrical connection to the backside electrode contacted by metal pad 106 can be made to the circuitry of the converter chip without relying on a bond wire connecting the metal pad to a package post to enable a connection back to the underlying converter chip. Of course, in some applications, bond pad 150 can be a "dummy" bond pad not connected to any circuitry of the underlying converter chip and is merely provided to facilitate the wire bonding process of the packaged integrated circuit.

FIG. 4 also illustrates an alternate connection method for the anode electrode of the Schottky diode. In FIG. 4, anode electrode 130 is connected by a bond wire 140 to a bond pad 152 on converter chip 108. Bond pad 152 is electrically coupled to bond pad 154. Another bond wire 142 connects bond pad 154 to package post 122. By connecting the anode electrode to a bond pad instead of the package post, a double-bond configuration at the package post is avoided.

Figure 5:
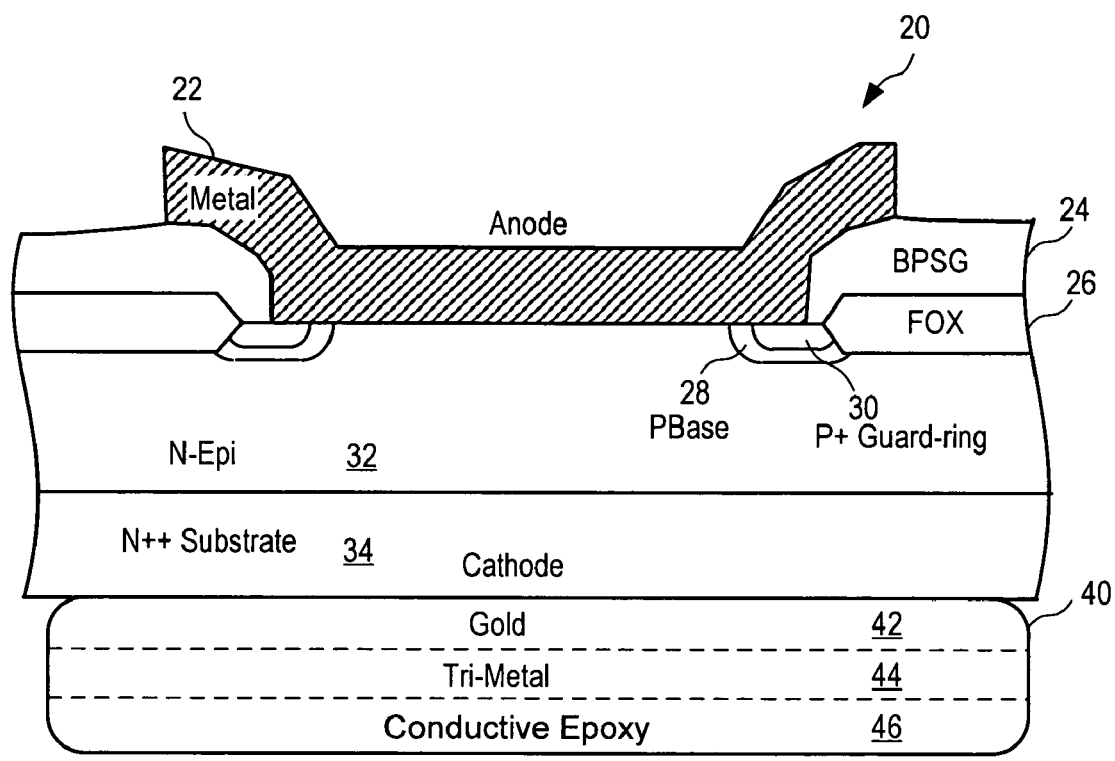
FIG. 5 is a cross-sectional view of a Schottky diode structure which can be used to form the discrete Schottky diode for use in the boost converter integrated circuit according to the method of the present invention.

The discrete Schottky diode used in the boost converter integrated circuit in the above description can be fabricated using a variety of diode structure. FIG. 5 is a cross-sectional view of a Schottky diode structure which can be used to form the discrete Schottky diode for use in the boost converter integrated circuit according to the method of the present invention. In FIG. 5, Schottky diode 20 with backside cathode terminal is fabricated using a low mask count process and therefore can be manufactured with reduced cost.

Referring to FIG. 5, Schottky diode 20 is formed in an N-Epi 32 on a heavily doped N++ substrate 34. To ensure an ohmic contact between N++ substrate 34 and the underlying conductive adhesive used to attach the diode to a metal pad, N++ substrate 34 is usually heavily doped using arsenic. N-Epi 32 can be formed in an epitaxial layer formed-on substrate 34. A field oxide layer 26 and an insulting layer, such as BPSG layer 24, are formed to define an opening to form the diode junction. A metal layer 22 is deposited on the surface of N-Epi 32 where the junction between the aluminum and the silicon substrate forms the Schottky diode junction. Metal layer 22 is typically aluminum or aluminum-alloy (AlSi or AlSiCu). In other embodiments, metal layer 22 can be formed using other metals, such as titanium (more specifically $TiSi_2$) or platinum (more specifically PtSi). P+ guardring 30 is usually formed around the perimeter of the diode junction to reduce electric field crowding effect. In some processes, a P-Base diffusion layer 28 can be used in addition to the P+ guardring. An array of Schottky diodes 20 is formed on a silicon wafer and individual discrete Schottky diodes are formed by scribing and dicing of the silicon wafer.

Aluminum layer 22 forms the anode terminal of Schottky diode 20 while the N++ substrate 34 forms the backside cathode terminal of the Schottky diode. FIG. 5 also illustrates one embodiment of a conductive adhesive layer 40 which can be used to attach the discrete Schottky diode to a metal pad formed on an underlying integrated circuit. In the embodiment shown in FIG. 5, conductive adhesive layer 40 is a multi-layer structure providing a low resistance connection to the metal pad on which the Schottky diode is to be attached. Specifically, conductive adhesive layer 40 includes a gold layer 42, a tri-metal layer 44 and a conductive epoxy layer 46. Gold layer 42 is used to provide a low resistance ohmic contact to the N++ silicon substrate 34. Tri-metal layer 44 is used to improve the adhesion and reduce the resistance between gold layer 42 and conductive epoxy layer 46. Finally, conductive epoxy layer 46 is used to attach Schottky diode 20 to a metal pad. In an alternate embodiment, gold layer 42 is a gold layer doped with 0.1% arsenic. Also, in some embodiments, the backside surface of substrate 34 may need to be roughened to improve the adhesion between the gold layer and the silicon wafer. Specifically, after the array of diodes is formed on the silicon wafer, the wafer is backlapped as is well known in the art to a given thickness. Then, the backside surface of the wafer is roughened, such as by using a coarse wheel grinder with a grit of 300–800.

FIG. 5 illustrates one embodiment of a conductive adhesive structure which can be used to attach the discrete Schottky diode to the metal pad one an underlying integrated circuit. In other embodiments, other conductive adhesive structures can also be used. The conductive adhesive structure should possess several important characteristics. First, the conductive adhesive structure needs to provide an ohmic contact between the backside terminal of the discrete electronic device and the metal pad. That is, the conductive adhesive structure should provide a low resistance connection. Second, in most circumstances, the discrete electronic device is attached to the underlying integrated circuit after the integrated circuit is mounted on the IC package. Therefore, the conductive adhesive structure should be capable of being formed at a temperature lower than the glass transition temperature of the IC package to avoid damage to the package. Third, the conductive adhesive structure should be capable of being formed at a temperature lower than the transition temperature of the die attach used by the underlying integrated circuit to attach to the IC package. In this manner, the die attach for the underlying integrated circuit is not degraded when the discrete electronic device is mounted.

In one embodiment, the conductive adhesive structure includes a tri-metal layer with conductive epoxy only. The gold layer is not used. In another embodiment, the conductive adhesive structure includes gold with an eutectic die attach. In other embodiments, soft-solder can also be used in place of the epoxy or the eutectic. Other die attach methods, such as ultrasonic, welding, or thermocompression, can also be used to implement the conductive adhesive structure.

In the above descriptions, the metal pad on which the discrete electronic device is mounted is described as a aluminum metal layer formed using one of the metallization layer of the fabrication process used to form the underlying integrated circuit. In other embodiments, the metal pad can be formed using gold or the metal pad can be gold covered. For instance, in one embodiment, the metal pad is formed using a layer of electroless nickel/gold on top of an aluminum layer.

Furthermore, in the above descriptions, the chip-on-chip integrated circuit packaging method is applied to attach one discrete electronic device to an underlying integrated circuit. In other embodiments, the chip-on-chip integrated circuit packing method can also be used to attach two or more discrete electronic devices to an underlying integrated circuit. The two discrete electronic devices can share a common metal pad and therefore have a common backside electrode or the two discrete electronic devices can each be provided with separate, isolated metal pads.

The chip-on-chip integrated circuit packaging method of the present invention provides many advantages. In particular, the method of the present invention provides an optimal solution to the problem of connecting a discrete electronic device to an associated integrated circuit. As described above, it is sometimes not desirable to integrate the electronic device onto the associated integrated circuit as such on-chip integration may require large amount of silicon space and additional fabrication process steps to build the on-chip electronic device. Large amount of silicon space is usually required for devices where the backside terminal needs to be brought up to the topside. On the other hand, it is also undesirable to use a separately packaged discrete electronic device as the discrete electronic device takes up valuable PC board space and increase the component count for the system.

When the chip-on-chip integrated circuit packaging method of the present invention is applied, a discrete electronic device can be "embedded" within the packaging of the associated integrated circuit, thereby avoiding the complexity of integrating the discrete electronic device on-chip while providing an integrated solution to reduce component count and use of PC board space.

The above detailed descriptions are provided to illustrate specific embodiments of the present invention and are not intended to be limiting. Numerous modifications and variations within the scope of the present invention are possible. The present invention is defined by the appended claims.

We claim:

1. A method for forming an integrated circuit package including a semiconductor chip having a passivation layer and a discrete electronic device, the method comprising:

providing a discrete electronic device having a first surface and a second surface opposite the first surface, the first surface comprising a single terminal being a backside electrode of the discrete electronic device, and the second surface comprises a second terminal, at least one of the backside electrode and the second terminal of the discrete electronic device being electronically coupled to the semiconductor chip;

forming a metal pad on the top surface of the passivation layer of the semiconductor chip;

attaching substantially the entire first surface of the discrete electronic device to the metal pad using a conductive adhesive structure to form an electrical connection between the backside electrode of the discrete electronic device and the metal pad;

forming an electrical connection from the metal pad to one of a bond pad of the semiconductor chip or a package post of the integrated circuit package; and encapsulating the semiconductor chip and the discrete electronic device to form the integrated circuit package.

2. The method of claim 1, wherein forming an electrical connection from the metal pad to one of a bond pad of the semiconductor chip or a package post of the integrated circuit package comprises forming an electrical connection from the metal pad to a first bond pad of the semiconductor chip.

3. The method of claim 2, wherein forming an electrical connection from the metal pad to a first bond pad of the semiconductor chip comprises:

forming a metal line on the top surface of the passivation layer of the semiconductor chip, the metal line connecting the metal pad to the first bond pad.

4. The method of claim 3, wherein the first bond pad connects to circuitry of the semiconductor chip.

5. The method of claim 1, wherein forming an electrical connection from the metal pad to one of a bond pad of the semiconductor chip or a package post of the integrated circuit package comprises forming an electrical connection from the metal pad to a first package post of the integrated circuit package.

6. The method of claim 5, wherein forming an electrical connection from the metal pad to a first package post of the integrated circuit package comprises:

connecting the metal pad to the first package post using a bond wire.

7. The method of claim 1, further comprising:

forming a second electrical connection using a bond wire from the second terminal on the second surface of the discrete electronic device to one of a bond pad of the semiconductor chip or a package post of the integrated circuit package.

8. The method of claim 1, wherein the metal pad comprises an aluminum pad.

9. The method of claim 1, wherein the conductive adhesive structure comprises a conductive epoxy.

10. The method of claim 9, wherein the conductive adhesive structure comprises a gold layer formed on the first surface of the discrete electronic device and a conductive epoxy layer formed on the gold layer for attaching to the metal pad.

11. The method of claim 10, wherein the gold layer is doped with 0.1% arsenic.

12. The method of claim 1 wherein the discrete electronic device comprises one of a Schottky diode, a VDMOS device, an NPN transistor and a PNP transistor.

13. The method of claim 1, further comprising:

prior to attaching the first surface of the discrete electronic device to the metal pad, roughening the first surface of the discrete electronic device using a coarse wheel grinder.

* * * * *